United States Patent
Tsukamoto et al.

(10) Patent No.: US 10,910,183 B2
(45) Date of Patent: Feb. 2, 2021

(54) POWER SUPPLY CONTROL DEVICE, POWER SUPPLY CONTROL METHOD, AND COMPUTER PROGRAM

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Katsuma Tsukamoto, Mie (JP); Kota Oda, Mie (JP)

(73) Assignees: AutoNetworks Technologies, Ltd., Mie (JP); Sumitomo Wiring Systems, Ltd., Mie (JP); Sumitomo Electric Industries, Ltd., Osaka (JP)

(*) Notice: Subject to any disclaimer, the term of this patent is extended or adjusted under 35 U.S.C. 154(b) by 115 days.

(21) Appl. No.: 16/302,423

(22) PCT Filed: May 16, 2017

(86) PCT No.: PCT/JP2017/018346
§ 371 (c)(1),
(2) Date: Nov. 16, 2018

(87) PCT Pub. No.: WO2017/199947
PCT Pub. Date: Nov. 23, 2017

(65) Prior Publication Data
US 2019/0279832 A1 Sep. 12, 2019

(30) Foreign Application Priority Data
May 19, 2016 (JP) .................. 2016-100808

(51) Int. Cl.
*H01H 47/32* (2006.01)
*H01H 47/02* (2006.01)
*H02J 7/00* (2006.01)

(52) U.S. Cl.
CPC ............ *H01H 47/32* (2013.01); *H01H 47/02* (2013.01); *H02J 7/00* (2013.01)

(58) Field of Classification Search
None
See application file for complete search history.

(56) References Cited

U.S. PATENT DOCUMENTS

2003/0193770 A1 10/2003 Chung
2012/0212210 A1 8/2012 Takeda
(Continued)

FOREIGN PATENT DOCUMENTS

JP S55-117843 A 9/1980
JP 2008-210638 A 9/2008
(Continued)

OTHER PUBLICATIONS

International Search Report for Application No. PCT/JP2017/018346 dated Aug. 22, 2017.

*Primary Examiner* — Jared Fureman
*Assistant Examiner* — Aqeel H Bukhari
(74) *Attorney, Agent, or Firm* — Honigman LLP

(57) ABSTRACT

A power supply control device controls the supply of power via a switch circuit and a relay contact. If the semiconductor switches are on and the relay contact is off, when a switch temperature of the switch circuit is at least a relay ON-threshold, the relay contact is switched on, and the semiconductor switches are switched off. If the semiconductor switches are off and the relay contact is on, when a switch temperature of the switch circuit is lower than a relay OFF-threshold, the semiconductor switches are switched on, and the relay contact is switched off. The relay OFF-threshold is not more than the relay ON-threshold.

9 Claims, 6 Drawing Sheets

(56) References Cited

U.S. PATENT DOCUMENTS

| | | | | |
|---|---|---|---|---|
| 2013/0015173 A1* | 1/2013 | Robinson | ............ | H05B 1/0236 |
| | | | | 219/209 |
| 2013/0154541 A1* | 6/2013 | Stickelmaier | ......... | H02J 7/0031 |
| | | | | 320/101 |
| 2014/0212289 A1* | 7/2014 | Thogersen | .............. | F03D 17/00 |
| | | | | 416/146 R |
| 2016/0352096 A1* | 12/2016 | Sachsenhausen | ........ | H02H 3/20 |

FOREIGN PATENT DOCUMENTS

| JP | 2011-078193 A | 4/2011 |
|---|---|---|
| JP | 2012-119104 A | 6/2012 |

\* cited by examiner

| State flag value | Switch state |
|---|---|
| Zero | Semiconductor switch: OFF<br>Relay contact: OFF |
| 1 | Semiconductor switch: ON<br>Relay contact: OFF |
| 2 | Semiconductor switch: OFF<br>Relay contact: ON |

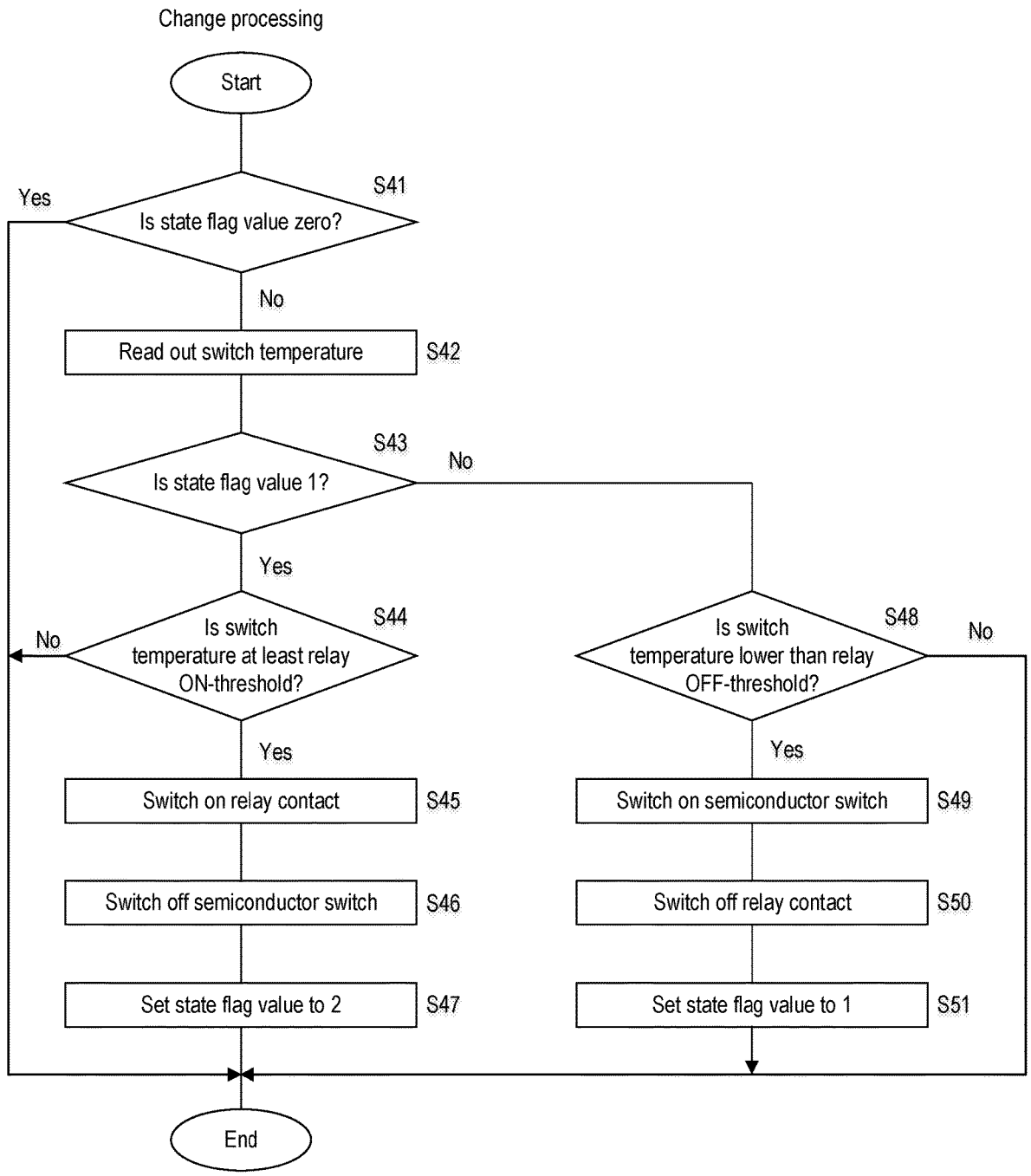

POWER SUPPLY CONTROL DEVICE, POWER SUPPLY CONTROL METHOD, AND COMPUTER PROGRAM

CROSS-REFERENCE TO RELATED APPLICATIONS

This application is the U.S. national stage of PCT/JP2017/018346 filed May 16, 2017, which claims priority of Japanese Patent Application No. JP 2016-100808 filed May 19, 2016.

TECHNICAL FIELD

The present disclosure relates to a power supply control device, a power supply control method, and a computer program.

BACKGROUND

Japanese Patent 5669086 discloses a power supply control device configured to control the supply of power from a power source to a load by switching on and off a switch provided on a power supply path through which power is supplied from the power source to a load. In this power supply control device, a parallel circuit, including a semiconductor switch and a relay contact, is provided on the power supply path through which power is supplied from the power source to the load. If the supply of power to a load is started, the semiconductor switch is switched on, and then the relay contact is switched on. Thereafter, the semiconductor switch is switched off. If the supply of power to a load is stopped, the semiconductor switch is switched on, and then the relay contact is switched off. Thereafter, the semiconductor switch is switched off.

With the power supply control device disclosed in Japanese Patent 5669086, if power is supplied to a load, then the relay contact is switched on from off, and if the supply of power to the load is stopped, the relay contact is switched off from on. Thus, the relay contact is frequently switched on and off.

The relay contact includes a NO (Normally Open) terminal, a COM (Common) terminal, and a rod-shaped conductor whose end portion is connected to the COM terminal. Bringing the conductor into contact with the NO terminal switches on the relay contact from off, and detaching the conductor from the NO terminal switches off the relay contact from on. In this manner, with the relay contact, the relay contact is switched on and off by physically moving the conductor, and thus the number of times of switching on and off is limited. Thus, if the number of times of switching on or off exceeds a predetermined number of times, for example, 30 thousand times, the relay contact needs to be replaced.

With the power supply control device disclosed in Japanese Patent 5669086, the relay contact is frequently switched on and off, and thus is problematic in that the relay contact should be replaced at short time intervals.

In view of this, an object is to provide a power supply control device, a power supply control method, and a computer program with a low frequency of switching on and off a relay contact.

SUMMARY

A power supply control device according to one aspect of the present disclosure is a power supply control device configured to control supply of power via a switch circuit including a semiconductor switch and a relay contact connected in parallel to the switch circuit, the power supply control device including a first determination unit configured to determine whether or not a switch temperature of the switch circuit is at least a first threshold when the semiconductor switch is on and the relay contact is off a first switching unit configured to, if the first determination unit has determined that the switch temperature is at least the first threshold, switch on the relay contact and switch off the semiconductor switch; a second determination unit configured to determine whether or not the switch temperature is lower than a second threshold that is not more than the first threshold when the semiconductor switch is off and the relay contact is on; and a second switching unit configured to, if the second determination unit has determined that the switch temperature is lower than the second threshold, switch on the semiconductor switch and switch off the relay contact.

A power supply control method according to one aspect of the present disclosure is a power supply control method for controlling supply of power via a switch circuit including a semiconductor switch and a relay contact connected in parallel to the switch circuit, the method including a step of determining whether or not a switch temperature of the switch circuit is at least a first threshold when the semiconductor switch is on and the relay contact is off a step of, if it is determined that the switch temperature is at least the first threshold, switching on the relay contact and switching off the semiconductor switch; a step of determining whether or not the switch temperature is lower than a second threshold that is not more than the first threshold when the semiconductor switch is off and the relay contact is on; and a step of, if it is determined that the switch temperature is lower than the second threshold, switching on the semiconductor switch and switching off the relay contact.

A computer program according to one aspect of the present disclosure is a computer program for causing a computer to control supply of power via a switch circuit including a semiconductor switch and a relay contact connected in parallel to the switch circuit, the program causing the computer to execute a step of determining whether or not a switch temperature of the switch circuit is at least a first threshold when the semiconductor switch is on and the relay contact is off a step of, if it is determined that the switch temperature is at least the first threshold, switching on the relay contact and switching off the semiconductor switch; a step of determining whether or not the switch temperature is lower than a second threshold that is not more than the first threshold when the semiconductor switch is off and the relay contact is on; and a step of, if it is determined that the switch temperature is lower than the second threshold, switching on the semiconductor switch and switching off the relay contact.

Note that the present disclosure can be realized as not only a power supply control device including such characteristic processing units but also a power supply control method including such characteristic processes as steps or a computer program for causing a computer to execute these steps. Also, the present disclosure can be realized as a semiconductor integrated circuit for realizing part of all of the power supply control device or as a power supply control system including the power supply control device.

Advantageous Effects of Disclosure

According to this disclosure, the frequency of switching on and off a relay contact is low.

BRIEF DESCRIPTION OF DRAWINGS

FIG. 7 is a flowchart showing a procedure of change processing.

DETAILED DESCRIPTION OF PREFERRED EMBODIMENTS

Figure 1:
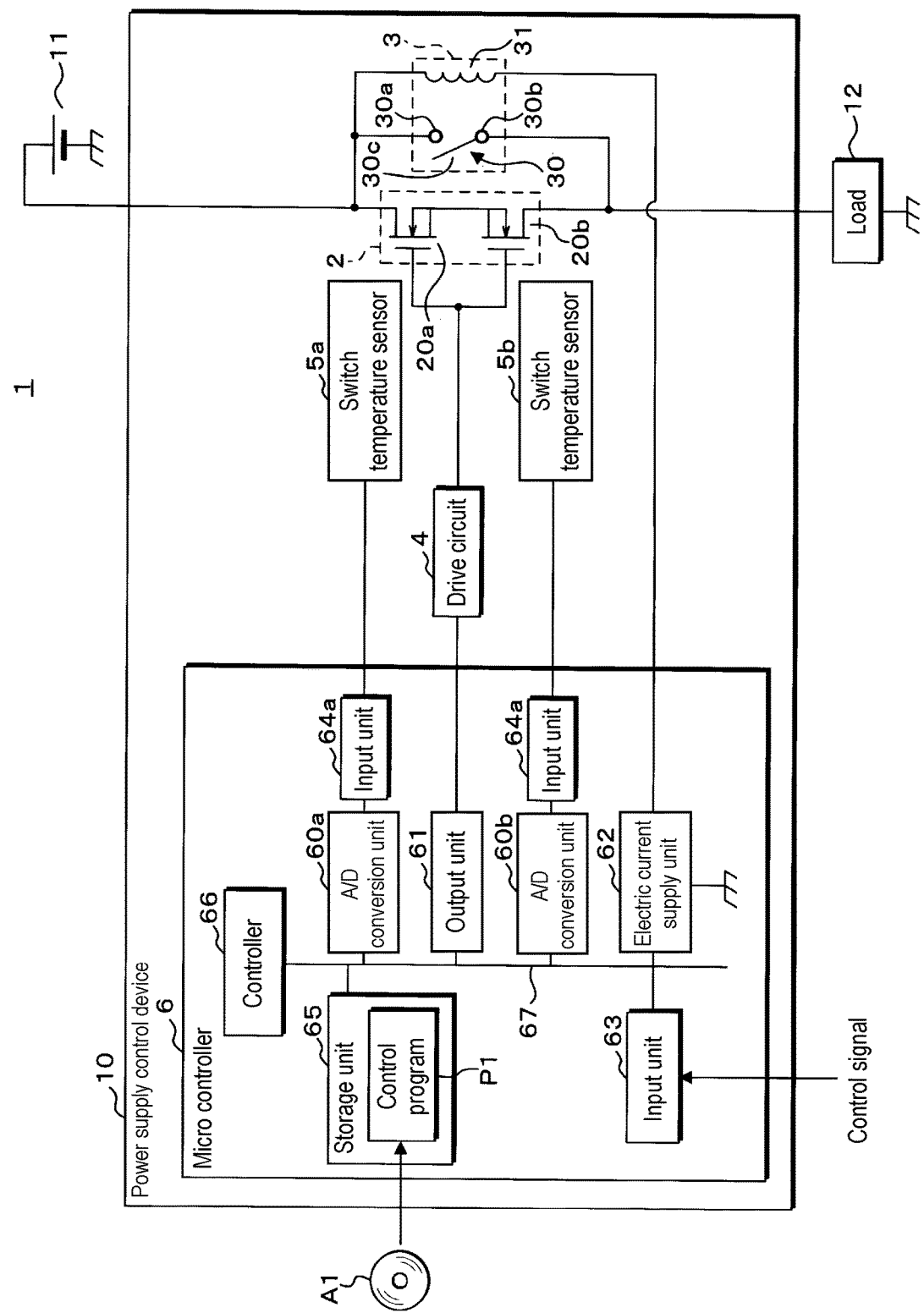
FIG. 1 is a block diagram showing the configuration of the main portions of a power supply system in Embodiment 1.

First, embodiments of the present disclosure will be described below. At least portions of embodiments described below may also be combined.

A power supply control device according to one aspect of the present disclosure is a power supply control device configured to control supply of power via a switch circuit including a semiconductor switch and a relay contact connected in parallel to the switch circuit, the power supply control device including a first determination unit configured to determine whether or not a switch temperature of the switch circuit is at least a first threshold when the semiconductor switch is on and the relay contact is off a first switching unit configured to, if the first determination unit has determined that the switch temperature is at least the first threshold, switch on the relay contact and switch off the semiconductor switch; a second determination unit configured to determine whether or not the switch temperature is lower than a second threshold that is not more than the first threshold when the semiconductor switch is off and the relay contact is on; and a second switching unit configured to, if the second determination unit has determined that the switch temperature is lower than the second threshold, switch on the semiconductor switch and switch off the relay contact.

In the power supply control device according to one aspect of the present disclosure, the semiconductor switch is an FET, and the switch temperature is a temperature at a drain of the semiconductor switch.

In the power supply control device according to one aspect of the present disclosure, the number of semiconductor switches of the switch circuit is two, a source of one of the semiconductor switches is connected to a source of the other of the semiconductor switches, the relay contact is connected between drains of the two semiconductor switches, and the switch temperature is the higher one of the temperatures at the drains of the two semiconductor switches.

The power supply control device according to one aspect of the present disclosure includes an electric current detection unit configured to detect an electric current flowing through the switch circuit, and a temperature calculation unit configured to calculate the switch temperature based on the electric current detected by the electric current detection unit.

The power supply control device according to one aspect of the present disclosure includes a temperature detection unit configured to detect an ambient temperature of the switch circuit, in which the temperature calculation unit includes a temperature difference calculation unit configured to chronologically calculate a temperature difference between the ambient temperature and the switch temperature of the switch circuit, the temperature difference calculation unit calculates the temperature difference between the electric current detected by the electric current detection unit and a preceding temperature difference that was calculated in advance, and the switch temperature is calculated by adding the temperature difference calculated by the temperature difference calculation unit to the ambient temperature detected by the temperature detection unit.

A power supply control method according to one aspect of the present disclosure is a power supply control method for controlling supply of power via a switch circuit including a semiconductor switch, and a relay contact connected in parallel to the switch circuit, the method including a step of determining whether or not a switch temperature of the switch circuit is at least a first threshold when the semiconductor switch is on and the relay contact is off a step of, if it is determined that the switch temperature is at least the first threshold, switching on the relay contact and switching off the semiconductor switch; a step of determining whether or not the switch temperature is lower than a second threshold that is not more than the first threshold when the semiconductor switch is off and the relay contact is on; and a step of, if it is determined that the switch temperature is lower than the second threshold, switching on the semiconductor switch and switching off the relay contact.

A computer program according to one aspect of the present disclosure is a computer program for causing a computer to control supply of power via a switch circuit including a semiconductor switch and a relay contact connected in parallel to the switch circuit, the program causing the computer to execute a step of determining whether or not a switch temperature of the switch circuit is at least a first threshold when the semiconductor switch is on and the relay contact is off a step of, if it is determined that the switch temperature is at least the first threshold, switching on the relay contact and switching off the semiconductor switch; a step of determining whether or not the switch temperature is lower than a second threshold that is not more than the first threshold when the semiconductor switch is off and the relay contact is on; and a step of, if it is determined that the switch temperature is lower than the second threshold, switching on the semiconductor switch and switching off the relay contact.

With the power supply control device, the power supply control method, and the computer program according to one aspect of the present disclosure, when the semiconductor switch is on and the relay contact is off, it is determined whether or not the switch temperature of the switch circuit is at least the first threshold. If the switch temperature is at least the first threshold, the relay contact is switched on, and the semiconductor switch is switched off. Also, when the semiconductor switch is off and the relay contact is on, it is determined whether or not the switch temperature of the switch circuit is lower than a second threshold. If the switch temperature is lower than the second threshold, the semiconductor switch is switched on, and the relay contact is switched off. The second threshold is not more than the first threshold.

If an electric current flows through the semiconductor switch, power is consumed by an ON-resistance of the semiconductor switch, and the temperature of the semiconductor switch increases. If the temperature of the semiconductor switch increases, the switch temperature of the switch circuit increases. If the switch temperature is at least the first threshold, the relay contact is switched on, and the semiconductor switch is switched off. Thus, the switch temperature does not exceed the first threshold, and the semiconductor switch is prevented from reaching a high temperature. Furthermore, only if the switch temperature is at least the first threshold or the switch temperature is lower than the second threshold, the relay contact is switched on or off. Thus, the frequency of switching on and off the relay contact is low.

In the power supply control device according to one aspect of the present disclosure, the semiconductor switch is an FET, and the switch temperature is a temperature at a drain of the semiconductor switch. The temperature at the drain of the semiconductor switch is higher than those of the other portions. Thus, the temperatures of all of the portions of the semiconductor switch do not exceed the first threshold.

In the power supply control device according to one aspect of the present disclosure, the switch circuit includes two semiconductor switches, and the source of one of the semiconductor switches is connected to the source of the other of the semiconductor switches. Because the semiconductor switch is an FET, a parasitic diode is formed between the drain and the source of the semiconductor switch. For example, if the two semiconductor switches are the same type, a cathode (or an anode) of a parasitic diode according to one of the semiconductor switches is connected to a cathode (or an anode) of a parasitic diode of the other semiconductor switch. Thus, even if a voltage is applied in a wrong direction between drains of the two semiconductor switches, no electric current flows between the drains of the two semiconductor switches as long as the two semiconductor switches are off.

Also, because the switch temperature is the higher one of the temperatures at the drains of the two semiconductor switches, the temperatures at the drains of the two semiconductor switches do not exceed the first threshold.

In the power supply control device according to one aspect of the present disclosure, an electric current flowing through the switch circuit is detected, and the switch temperature is calculated based on the detected electric current. The semiconductor switches of the switch circuit and the relay contact are switched on and off based on the calculated switch temperature.

In the power supply control device according to one aspect of the present disclosure, a temperature difference between the ambient temperature and the switch temperature of the switch circuit is calculated chronologically. Here, a temperature difference is accurately calculated based on a preceding temperature difference that was calculated in advance and the electric current flowing through the switch circuit, this temperature difference is added to the ambient temperature of the switch circuit, and thereby an accurate switch temperature is calculated.

DETAILED DESCRIPTION OF EMBODIMENTS OF DISCLOSURE

A specific example of a power supply control device according to an embodiment of the present disclosure will be described with reference to the drawings. Note that the present disclosure is not limited to these examples, but is indicated by the scope of the claims, and all changes that come within the meaning and range of equivalency of the claims are intended to be embraced therein.

Embodiment 1

FIG. 1 is a block diagram showing the configuration of the main portions of a power supply system 1 in Embodiment 1. The power supply system 1 is suitably installed in a vehicle, and includes a power supply control device 10, a battery, and a load 12. The power supply control device 10 is connected to a positive electrode of the battery 11, and one end of the load 12. A negative electrode of the battery 11 and the other end of the load 12 are grounded.

The battery 11 supplies power to the load 12 via the power supply control device 10. The load 12 is an electric device installed in the vehicle. When power is supplied from the battery 11 to the load 12, the load 12 is activated. When the supply of power from the battery 11 to the load 12 is stopped, the load 12 stops operating. The power supply control device 10 receives a control signal for instructing the power supply control device 10 to activate the load 12 or stop operation of the load 12. The power supply control device 10 controls the supply of power from the battery 11 to the load 12 in accordance with the content of the instruction of the received control signal.

The power supply control device 10 includes a switch circuit 2, a relay 3, a drive circuit 4, switch temperature sensors 5a and 5b, and a microcontroller 6. The switch circuit 2 includes two semiconductor switches 20a and 20b. The semiconductor switches 20a and 20b are N-channel FETs (Field Effect Transistors). The relay 3 includes a relay contact 30 and a relay coil 31. The relay contact 30 includes a NO-terminal 30a, a COM-terminal 30b, and a rod-shaped conductor 30c. An end of the conductor 30c is connected to the COM-terminal 30b. The drive circuit 4 has an input terminal and an output terminal.

In the power supply control device 10, the drain of the semiconductor switch 20a of the switch circuit 2 is connected to the positive electrode of the battery 11. In the switch circuit 2, the source of the semiconductor switch 20a is connected to the source of the semiconductor switch 20b. The drain of the semiconductor switch 20b is connected to one end of the load 12. The relay contact 30 is connected in parallel to the switch circuit 2. Specifically, the NO-terminal 30a of the relay contact 30 is connected to the drain of the semiconductor switch 20a, and the COM-terminal 30b of the relay contact 30 is connected to the drain of the semiconductor switch 20b.

Herein, "parallel" does not mean parallel in a strict meaning. The relay contact 30 may be connected substantially in parallel to the switch circuit 2. For example, the relay contact 30 may also be connected in parallel to a series circuit of the switch circuit 2 and a resistor.

One end of the relay coil 31 is further connected to the drain of the semiconductor switch 20a. The other end of the relay coil 31 is connected to the microcontroller 6. Gates of the semiconductor switches 20a and 20b are connected to the output terminal of the drive circuit 4. The input terminal of the drive circuit 4 is connected to the microcontroller 6. Furthermore, the two switch temperature sensors 5a and 6b are separately connected to the microcontroller 6.

If the voltages at the gates of the semiconductor switches 20a and 20b have at least a certain value, an electric current can flow between the drains and the sources. At this time, the semiconductor switches 20a and 20b are on. Also, if the voltages at the gates of the semiconductor switches 20a and 20b have less than a certain value, no electric current flows between the drains and the sources. At this time, the semiconductor switches 20a and 20b are off.

The drive circuit 4 switches on and off the semiconductor switches 20a and 20b approximately simultaneously by adjusting the voltages at the gates of the semiconductor switches 20a and 20b. The drive circuit 4 receives a switching signal to instruct the drive circuit 4 to switch on and off the semiconductor switches 20a and 20b. The drive circuit 4 switches on and off the semiconductor switches 20a and 20b in accordance with the content of the instruction of the received switching signal.

The switch temperature sensor 5a detects the temperature at the drain of the semiconductor switch 20a. The switch temperature sensor 5a outputs analog switch temperature information indicating the detected temperature to the microcontroller 6.

Similarly, the switch temperature sensor 5b detects the temperature at the drain of the semiconductor switch 20b. The switch temperature sensor 5b outputs analog switch temperature information indicating the detected temperature to the microcontroller 6.

The other end of the relay coil 31 of the relay 3 is open or grounded. If the other end of the relay coil 31 is open, no electric current flows through the relay coil 31. At this time, at the relay contact 30, the conductor 30c detaches from the NO-terminal 30a. If the conductor 30c is located away from the NO-terminal 30a, no electric current flows between the NO-terminal 30a and the COM-terminal 30b, and the relay contact 30 is off.

If the other end of the relay coil 31 is grounded, an electric current flows from the battery 11 through the relay coil 31, and a magnetic field is generated around the relay coil 31. Accordingly, the conductor 30c of the relay contact 30 is attracted to the NO-terminal 30a, and the conductor 30c comes into contact with the NO-terminal 30a. At this time, an electric current can flow between he NO-terminal 30a and the COM-terminal 30b of the relay contact 30, and the relay contact 30 is on.

The microcontroller 6 switches off the relay contact 30 by opening the other end of the relay coil 31, and switches on the relay contact 30 by grounding the other end of the relay coil 31.

A control signal is input to the microcontroller 6. The microcontroller 6 causes the drive circuit 4 to switch on and off the two semiconductor switches 20a and 20b, and switches on and off the relay contact 30, based on the content of the instruction of the input control signal and the detected temperature indicated by the switch temperature information that is input by the switch temperature sensors 5a and 5b.

The microcontroller 6 includes A (Analog)/D (Digital) conversion units 60a and 60b, an output unit 61, an electric current supply unit 62, input units 63, 64a, and 64b, a storage unit 65, and a controller 66. The A/D conversion units 60a and 60b, the output unit 61, the electric current supply unit 62, the input unit 63, the storage unit 65, and the controller 66 are connected to a bus 67. The A/D conversion units 60a and 60b are respectively connected to the input units 64a and 64b, in addition to the bus 67. Furthermore, the input units 64a and 64b are respectively connected to the switch temperature sensors 5a and 5b. The electric current supply unit 62 is connected to the other end of the relay coil 31 of the relay 3, in addition to the bus 67. Also, the electric current supply unit 62 is grounded.

The input units 64a and 64b receive analog switch temperature information respectively from the switch temperature sensors 5a and 5b. The input units 64a and 64b respectively output the analog switch temperature information that was received from the switch temperature sensors 5a and 5b to the A/D conversion units 60a and 60b.

The A/D conversion units 60a and 60b convert the analog switch temperature information received from the input units 64a and 64b into digital switch temperature information. The controller 66 acquires the digital switch temperature information from the A/D conversion units 60a and 60b.

A detected temperature indicated by the switch temperature information that the controller 66 acquired from the A/D conversion unit 60a approximately coincides with a detected temperature detected by the switch temperature sensor 5a at acquisition time. Similarly, a detected temperature indicated by the switch temperature information that the controller 66 acquired from the A/D conversion unit 60b approximately coincides with a detected temperature detected by the switch temperature sensor 5b at acquisition time.

The output unit 61 outputs a switching signal to the drive circuit 4 in accordance with an instruction received from the controller 66.

The electric current supply unit 62 opens and grounds the other end of the relay coil 31 in accordance with an instruction received from the controller 66. As described above, if the other end of the relay coil 31 is opened, the relay contact 30 is switched off, and if the other end of the relay coil 31 is grounded, the relay contact 30 is switched on.

A control signal is input to the input unit 63. The input unit 63 communicates the content of the instruction of the input control signal to the controller 66.

The storage unit 65 is a non-volatile memory. A control program P1 is stored in the storage unit 65.

The controller 66 includes a CPU (Central Processing Unit) (not shown). The CPU of the controller 66 executes load control processing for controlling operations of the load 12 and change processing for changing a switch for connecting the battery 11 and the load 12 to the semiconductor switches 20a and 20b or the relay contact 30, by executing the control program P1 stored in the storage unit 65. The control program P1 is a computer program for causing the controller 66 to execute the load control processing and the change processing.

Note that the control program P1 may also be stored in a storage medium A1 in a computer-readable manner. In this case, the control program P1 that is read out by a reading device (not shown) from the storage medium A1 is stored in the storage unit 65. The storage medium A1 is an optical disk, a flexible disk, a magnetic disk, a magneto-optical disk, or a semiconductor memory, for example. The optical disk is a CD (Compact Disc)-ROM (Read Only Memory), a DVD (Digital Versatile Disc)-ROM, or a BD (Blu-ray (registered trademark) Disc), for example. The magnetic disk is a hard disk, for example. Also, the control program P1 may be downloaded from an external apparatus (not shown) connected to a communication network (not shown), and the downloaded control program P1 may be stored in the storage unit 65.

State flag values are stored in the storage unit 65. The state flag values indicate switch states of the semiconductor switches 20a and 20b and the relay contact 30.

Figures 2, 3:
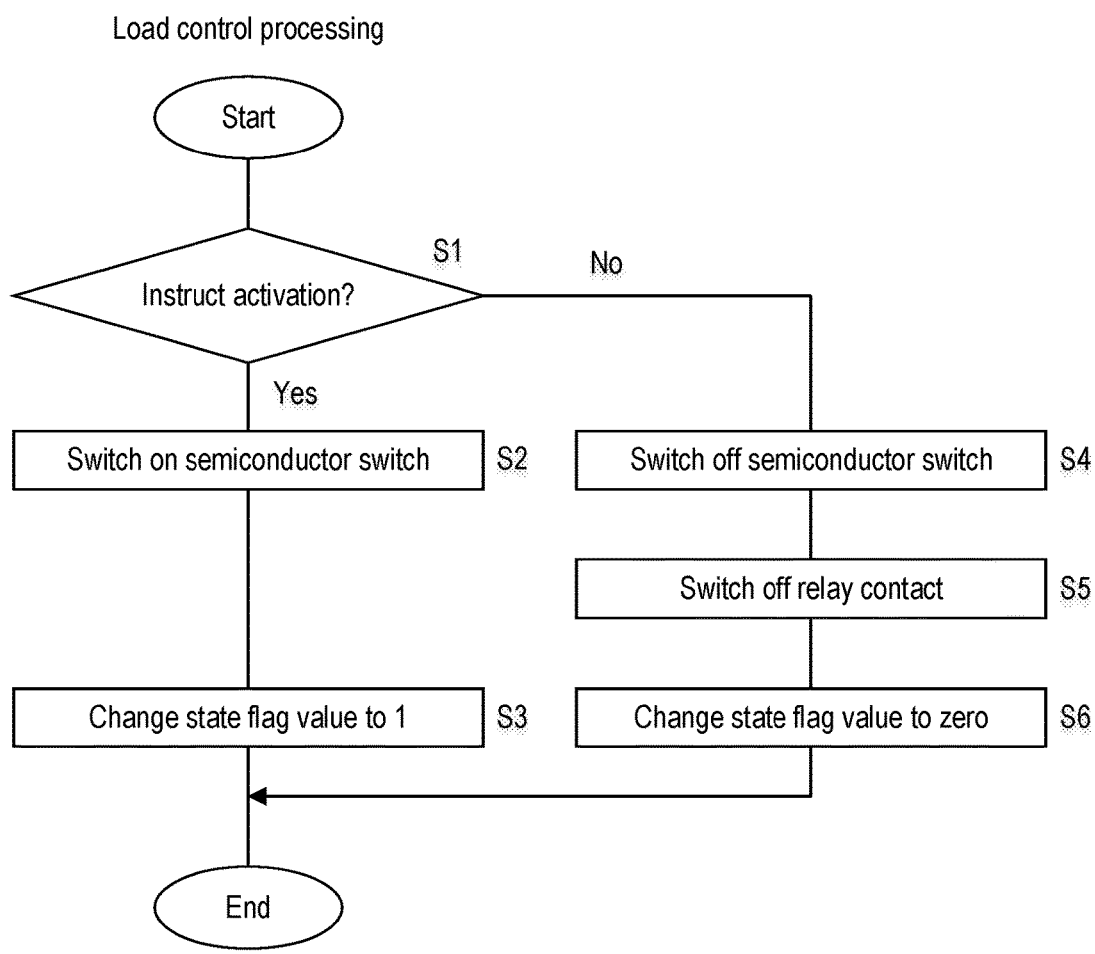
FIG. 2 is a table illustrating state flags.
FIG. 3 is a flowchart showing a procedure of load control processing.

FIG. 2 is a table illustrating the state flags. As shown in FIG. 2, when the state flag value is zero, the semiconductor switches 20a and 20b are off, and the relay contact 30 is off. When the state flag value is 1, the semiconductor switches 20a and 20b are on, and the relay contact 30 is off. When the state flag value is 2, the semiconductor switches 20a and 20b are off, and the relay contact 30 is on. The state flag value is changed by the controller 66 in accordance with switch states of the semiconductor switches 20a and 20b and the relay contact 30.

FIG. 3 is a flowchart showing a procedure of the load control processing. The controller 66 executes the load control processing every time the control signal is input to the input unit 63. The control signal indicating the activation of the load 12 is input to the input unit 63 in a state in which the semiconductor switches 20a and 20b and the relay contact 30 are off. The control signal indicating the stop of the operation of the load 12 is input to the input unit 63 in a state in which the semiconductor switches 20a and 20b are on or the relay contact 30 is on.

First, the controller 66 determines whether or not the control signal that was input to the input unit 63 indicates the activation of the load 12 (step S1). If the controller 66 has determined that the control signal indicates the activation (step S1: YES), then the controller 666 causes the drive circuit 4 to switch on the semiconductor switches 20a and 20b from off (step S2). Specifically, the controller 66 instructs the output unit 61 to output, to the drive circuit 4, a switching signal for instructing switching on the semiconductor switches 20a and 20b. Accordingly, the drive circuit 4 switches on the semiconductor switches 20a and 20b.

As described above, because the control signal indicating the activation of the load 12 is input to the input unit 63 in a state in which the semiconductor switches 20a and 20b and the relay contact 30 are off, step S2 is executed in a state in which the semiconductor switches 20a and 20b and the relay contact 30 are off. As a result of the execution of step S2, the semiconductor switches 20a and 20b are switched on in a state in which the relay contact 30 is kept off, and power is supplied from the battery 11 to the load 12 via the switch circuit 2.

After executing step S2, the controller 66 changes the state flag value to 1 (step S3). After executing step S3, the controller 66 ends the load control processing.

If the controller 66 has determined that the control signal that was input to the input unit 63 does not instruct the activation of the load 12, that is, the control signal that was input to the input unit 63 instructs the stop of the operation of the load 12 (step S1: NO), then the controller 66 causes the drive circuit 4 to switch off the semiconductor switches 20a and 20b (step S4). Specifically, the controller 66 instructs the output unit 61 to output, to the drive circuit 4, a switching signal for instructing switching off the semiconductor switches 20a and 20b. Accordingly, the drive circuit 4 switches off the semiconductor switches 20a and 20b.

After executing step S4, the controller 66 causes the electric current supply unit 62 to switch off the relay contact 30 (step S5). Specifically, the controller 66 instructs the electric current supply unit 62 to open the other end of the relay coil 31. Accordingly, the conductor 30c detaches from the NO-terminal 30a, and the relay contact 30 is switched off. The supply of power from the battery 11 to the load 12 is stopped by the controller 66 executing steps S4 and S5.

After executing step S5, the controller 66 changes the state flag value to zero (step S6). After executing step S6, the controller 66 ends the load control processing.

Figure 4:
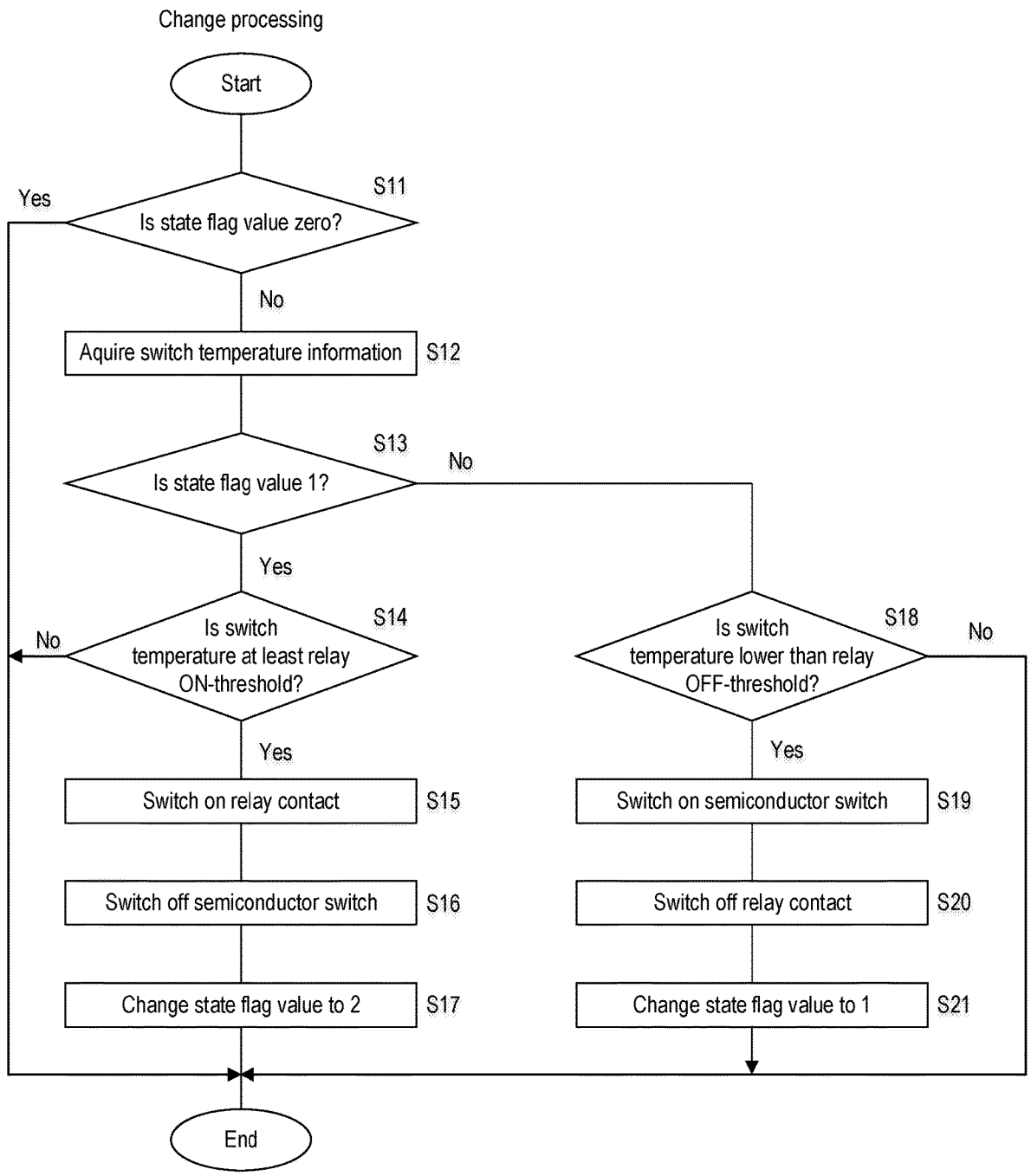
FIG. 4 is a flowchart showing a procedure of change processing.

FIG. 4 is a flowchart showing a procedure of the change processing. The controller 66 cyclically executes the change processing. First, the controller 66 determines whether or not the state flag value is zero (step S11). If the controller 66 has determined that the state flag value is zero (step S11: YES), then the controller 66 ends the change processing.

If the controller 66 has determined that the state flag value is not zero (step S11: NO), then the controller 66 acquires digital switch temperature information separately from the A/D conversion units 60a and 60b (step S12). The controller 66 takes, as the switch temperature of the switch circuit 2, the higher one of the two detected temperatures indicated by the information on the two switch temperatures acquired in step S12.

After executing step S12, the controller 66 determines whether or not the state flag value is 1 (step S13). If the controller 66 has determined that the state flag value is 1 (step S13: YES), then the controller 66 determines whether or not the switch temperature is at least a relay ON-threshold (step S14). The relay ON-threshold is constant and stored in the storage unit 65 in advance. If the controller 66 has determined that the switch temperature is lower than the relay ON-threshold (step S14: NO), then the controller 66 ends the change processing. The relay ON-threshold corresponds to a first threshold, and the controller 66 functions as a first determination unit.

If the controller 66 has determined that the switch temperature is at least the relay ON-threshold (step S14: YES), then the controller 66 causes the electric current supply unit 62 to switch on the relay contact 30 (step S15). Specifically, the controller 66 instructs the electric current supply unit 62 to ground the other end of the relay coil 31. Accordingly, the relay contact 30 is switched on.

After executing step S15, the controller 66 causes the drive circuit 4 to switch off the semiconductor switches 20a and 20b (step S16). Similarly to step S4 of the load control processing, the controller 66 executes step S16. Power is supplied from the battery 11 to the load 12 by the controller 66 executing steps S15 and S16. The drive circuit 4 and the electric current supply unit 62 function as first switching units.

After executing step S16, the controller 66 changes the state flag value to 2 (step S17) and ends the change processing.

If the controller 66 has determined that the state flag value is not 1, that is, has determined that the state flag value is 2 (step S13: NO), then the controller 66 determines whether or not the switch temperature is lower than a relay OFF-threshold (step S18). The relay OFF-threshold is constant and stored in the storage unit 65 in advance. The relay OFF-threshold is lower than the relay ON-threshold. If the controller 66 has determined that the switch temperature is at least the relay OFF-threshold (step S18: NO), then the controller 66 ends the change processing. The relay OFF-threshold corresponds to a second threshold, and the controller 66 also functions as a second determination unit.

If the controller 66 has determined that the switch temperature is lower than the relay OFF-threshold (step S18: YES), then the controller 66 causes the drive circuit 4 to switch on the semiconductor switches 20a and 20b (step S19), and causes the electric current supply unit 62 to switch off the relay contact 30 (step S20). Similarly to step S2 of the load control processing, the controller 66 executes step S19, and similarly to step S5 of the load control processing, executes step S20. Power is supplied from the battery 11 to the load 12 via the semiconductor switches 20a and 20b by the controller 66 executing steps S19 and S20. The drive circuit 4 and the electric current supply unit 62 also function as second switching units.

After executing step S20, the controller 66 changes the state flag value to 1 (step S21) and ends the change processing.

As described above, in the load control processing and the change processing, the controller 66 controls the supply of power via the switch circuit 2 and the relay contact 30 by causing the drive circuit 4 and the electric current supply unit 62 to switch on and off the semiconductor switches 20a and 20b and the relay contact 30.

In the power supply control device 10, if an electric current flows through the semiconductor switches 20a and 20b, power is consumed by ON-resistances of the semiconductor switches 20a and 20b, and the temperatures of the semiconductor switches 20a and 20b increase. In the change processing, if the switch temperature, that is, the higher one of the temperatures at the drains of the semiconductor switches 20*a* and 20*b* is at least the relay ON-threshold, the relay contact 30 is switched on, and the semiconductor switches 20*a* and 20*b* are switched off. Thus, the temperatures at the drains of the semiconductor switches 20*a* and 20*b* do not exceed the relay ON-threshold, and the semiconductor switches 20*a* and 20*b* are prevented from having a high temperature.

The temperatures at the drains of the semiconductor switches 20*a* and 20*b* are higher than those of the other portions. Thus, the temperatures of all of the portions of the semiconductor switches 20*a* and 20*b* do not exceed the relay ON-threshold.

Also, the relay contact 30 is switched on or off only if the switch temperature is at least the relay ON-threshold in a state in which the state flag value is 1, or if the switch temperature is lower than the relay OFF-threshold in a state in which the state flag value is 2. Thus, the frequency of switching on and off the relay contact 30 is low.

Furthermore, parasitic diodes (not shown) are formed between the drains and the sources of the semiconductor switches 20*a* and 20*b*. In an N-channel FET, a cathode and an anode of the parasitic diode are respectively connected to the drain and the source. In the power supply control device 10, the source of the semiconductor switch 20*a* is connected to the source of the semiconductor switch 20*b*. Thus, even if a voltage is applied in a wrong direction between the drains of the two semiconductor switches 20*a* and 20*b*, no electric current flows between the drains of the two semiconductor switches 20*a* and 20*b* as long as the two semiconductor switches 20*a* and 20*b* are off. For example, if the positive electrode of the battery 11 is grounded, and the negative electrode of the battery 11 is connected to the drain of the semiconductor switch 20*a*, a voltage is applied in a wrong direction between the drains of the two semiconductor switches 20*a* and 20*b*.

As described above, the relay OFF-threshold is lower than the relay ON-threshold. Thus, even if the switch temperature varies in a narrow temperature range including the relay ON-threshold or the relay OFF-threshold, the relay contact 30 is not frequently switched on and off unless both the relay ON-threshold and the relay OFF-threshold are included in this temperature range.

Note that the temperatures detected by the switch temperature sensors 5*a* and 5*b* are not limited to the temperatures at the drains of the semiconductor switches 20*a* and 20*b*, and may also be ambient temperatures of the semiconductor switches 20*a* and 20*b*, for example. In this case, the switch temperature is the higher one of the ambient temperatures of the semiconductor switches 20*a* and 20*b*.

The power supply control device 10 having such a configuration achieves, out of the above-described effects, all effects other than the effect attained by the switch temperature being the higher one of the temperatures at the drains of the semiconductor switches 20*a* and 20*b*.

Embodiment 2

In Embodiment 1, the switch temperature is one of the temperature detected by the switch temperature sensors 5*a* and 5*b*. However, the switch temperature may also be calculated, instead of detecting the switch temperature.

Hereinafter, Embodiment 2 will be described in terms of differences from Embodiment 1. Configurations other than the later-described configurations are similar to those in Embodiment 1, and thus constituent portions that are similar to those in Embodiment 1 are given similar reference numerals, and their redundant description will be omitted.

Figure 5:
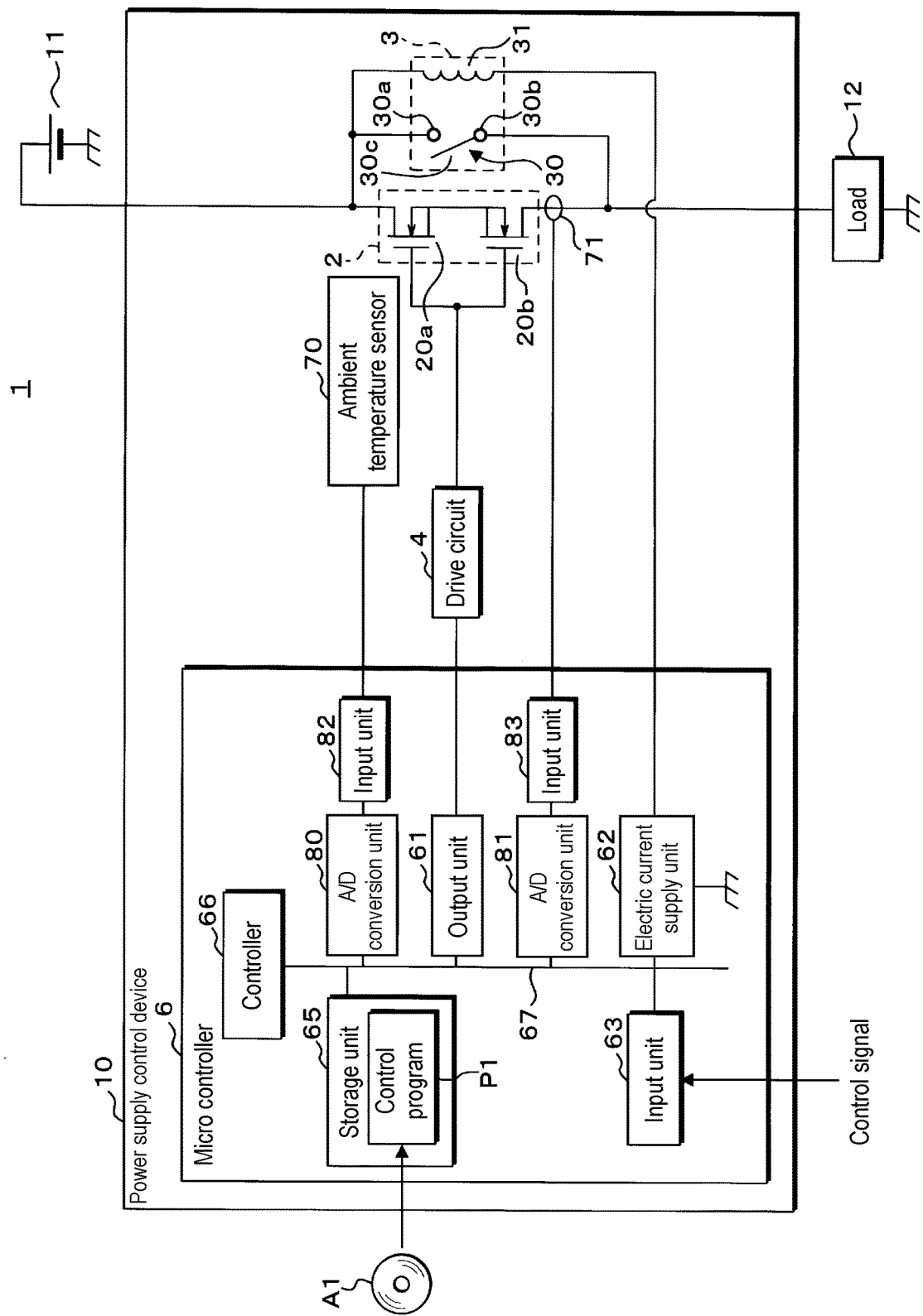
FIG. 5 is a block diagram showing the configuration of the main portions of a power supply system in Embodiment 2.

FIG. 5 is a block diagram showing the configuration of the main portions of a power supply system 1 in Embodiment 2. Similarly to Embodiment 1, a power supply control device 10 in Embodiment 2 includes a switch circuit 2, a relay 3, a drive circuit 4, and a microcontroller 6. These are connected similarly to Embodiment 1. Furthermore, the power supply control device 10 in Embodiment 2 includes an ambient temperature sensor 70 and an electric current sensor 71. The ambient temperature sensor 70 and the electric current sensor 71 are individually connected to the microcontroller 6. The electric current sensor 71 encloses a lead wire that connects one end of a load 12 and a drain of the semiconductor switch 20*b*. The electric current sensor 71 is located at a position that is closer to the semiconductor switch 20*b* than a connection point at which a COM-terminal 30*b* of a relay contact 30 is connected to the drain of the semiconductor switch 20*b*.

The ambient temperature sensor 70 detects an ambient temperature of the switch circuit 2, and outputs analog ambient temperature information indicating the detected ambient temperature to the microcontroller 6. The ambient temperature sensor 70 functions as a temperature detection unit.

The electric current sensor 71 detects an electric current flowing from the battery 11 to the load 12 via the switch circuit 2, and outputs the analog electric current information indicating the detected electric current to the microcontroller 6. The electric current sensor 71 functions as an electric current detection unit.

The microcontroller 6 calculates a switch temperature of the switch circuit 2 based on the ambient temperature indicated by the ambient temperature information that is input from the ambient temperature sensor 70 and the electric current information that is input from the electric current sensor 71. The microcontroller 6 causes the drive circuit 4 to switch on and off the two semiconductor switches 20*a* and 20*b*, and switches on and off the relay contact 30, based on the content indicated by the input control signal and the calculated switch temperature.

Similarly to Embodiment 1, in Embodiment 2, the microcontroller 6 includes an output unit 61, an electric current supply unit 62, an input unit 63, a storage unit 65, and a controller 66. These are connected similarly to Embodiment 1. Furthermore, the microcontroller 6 in Embodiment 2 includes A/D conversion units 80 and 81 and input units 82 and 83. Similarly to the output unit 61, the electric current supply unit 62, the input unit 63, the storage unit 65, and the controller 66, the A/D conversion units 80*a* and 81*b* are connected to a bus 67. The A/D conversion units 80 and 81 are respectively connected to the input units 82 and 83. The input unit 82 is further connected to the ambient temperature sensor 70, and the input unit 83 is further connected to the electric current sensor 71.

The input unit 82 receives analog ambient temperature information from the ambient temperature sensor 70. The input unit 82 outputs, to the A/D conversion unit 80, the analog ambient temperature information that was received from the ambient temperature sensor 70.

The A/D conversion unit 80 converts the analog ambient temperature information that was input from the input unit 82 to digital ambient temperature information. The controller 66 acquires digital ambient temperature information from the A/D conversion unit 80. The ambient temperature indicated by the ambient temperature information that the controller 66 acquired from the A/D conversion unit 80 approximately coincides with the ambient temperature detected by the ambient temperature sensor 70.

The input unit 83 receives the analog electric current information from the electric current sensor 71. The input unit 83 outputs, to the A/D conversion unit 81, the analog electric current information that was received from the electric current sensor 71.

The A/D conversion unit 81 converts the analog electric current information that was input from the input unit 83 to digital electric current information. The controller 66 acquires digital electric current information from the A/D conversion unit 81. The electric current indicated by the electric current information that the controller 66 acquired from the A/D conversion unit 81 approximately coincides with the electric current detected by the electric current sensor 71.

The controller 66 executes load control processing for controlling operations of the load 12, change processing for changing a switch for connecting the battery 11 and the load 12 to the semiconductor switches 20a and 20b or the relay contact 30, and temperature update processing for updating the switch temperature by executing the control program P1.

The load control processing in Embodiment 2 is similar to the load control processing in Embodiment 1.

The controller 66 cyclically executes the temperature update processing, and calculates a temperature difference ΔTs between the switch temperature and the ambient temperature of the switch circuit 2 in the temperature update processing. Specifically, the controller 66 calculates a temperature difference ΔTs by substituting an ambient temperature Ta indicated by the ambient temperature information acquired from the A/D conversion unit 80, an electric current Is indicated by the electric current information acquired from the A/D conversion unit 81, and a preceding temperature difference ΔTp that was calculated previously into Computing Equations (1) and (2) below.

$$\Delta Ts = \Delta Tp \times \exp(-\Delta t/\tau) + Rth \times Rs \times Is^2 \times (1-\exp(-\Delta t/\tau)) \quad (1)$$

$$Rs = Ro \times (1 + \kappa \times (Ta + \Delta Tp - To)) \quad (2)$$

Variables and constants that are used in Computing Equations (1) and (2) will be described below. The unit of the variables and constants are also shown in the description of the variables and constants. As described above, ΔTs, ΔTp, Ta, and Is respectively represent a temperature difference (° C.) to be calculated, a preceding temperature difference (° C.), the ambient temperature (° C.) of the switch circuit 2, and an electric current (A) flowing through the switch circuit 2. "Δt" represents a time interval (s) at which the temperature difference ΔTs is calculated. "τ" represents a heat dissipation time constant (s) of the switch circuit 2

"Rth" represents a thermal resistance (° C./W) of the switch circuit 2, and Rs represents a resistance value (Ω) of the switch circuit 2, that is, the sum of ON-resistance values of the semiconductor switches 20a and 20b. "To" represents a predetermined temperature (° C.), and Ro represents a resistance value (Ω) of the switch circuit 2 at the temperature To. "κ" represents a resistance temperature coefficient (/° C.) of the switch circuit 2. ΔTs, ΔTp, Iw, and Ta are variables, and Δt, τ, Rth, Ro, κ, and To are preset constants.

The longer the time interval Δt is, the lower a value of the first term of Computing Equation (1) is, and thus the first term of Computing Equation (1) expresses heat dissipation of the switch circuit 2. Also, the longer the time interval Δt is, the higher a value of the second term of Computing Equation (1) is, and thus the second term of Computing Equation (1) expresses heat generation of the switch circuit 2.

As a matter of course, if the semiconductor switches 20a and 20b are off, the electric current Is is zero (A). In this case, because Computing Equation (1) is constituted by only the first term expressing heat dissipation, the temperature difference ΔTs to be calculated decreases.

The preceding temperature difference ΔTp is stored in the storage unit 65. In the temperature update processing, the controller 66 updates the preceding temperature difference ΔTp stored in the storage unit 65 to the calculated temperature difference ΔTs.

The switch temperature of the switch circuit 2 is also stored in the storage unit 65. In the temperature update processing, the controller 66 calculates the switch temperature by adding the calculated temperature difference ΔTs to the ambient temperature Ta indicated by the ambient temperature information that was acquired from the A/D conversion unit 80, and updates the switch temperature stored in the storage unit 65 to the calculated switch temperature.

Figure 6:
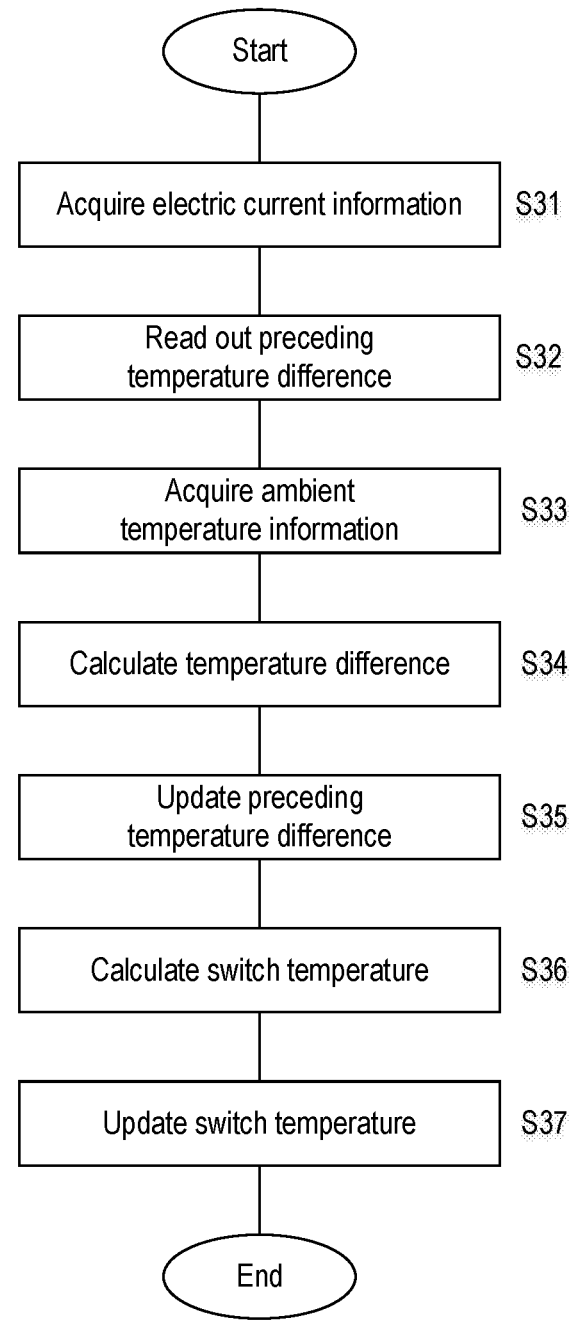
FIG. 6 is a flowchart showing a procedure of temperature update processing.

FIG. 6 is a flowchart showing a procedure of the temperature update processing. As described above, the controller 66 cyclically executes the temperature update processing, and cyclically calculates a temperature difference between the switch temperature and the ambient temperature of the switch circuit 2. First, the controller 66 acquires electric current information from the A/D conversion unit 81 (step S31), reads out the preceding temperature difference stored in the storage unit 65 (step S32), and acquires ambient temperature information from the A/D conversion unit 80 (step S33). Next, the controller 66 calculates the temperature difference ΔTs between the switch temperature and the ambient temperature of the switch circuit 2 by substituting the electric current Is indicated by the electric current information acquired in step S31, the preceding temperature difference ΔTp that was read out in step S32, and the ambient temperature Ta indicated by the ambient temperature information acquired in step S33 into Computing Equations (1) and (2) (step S34). The controller 66 also functions as the temperature difference calculation unit.

The controller 66 updates the preceding temperature difference ΔTp stored in the storage unit 65 to the temperature difference ΔTs calculated in step S34 (step S35). Next, the controller 66 calculates the switch temperature of the switch circuit 2 by adding the temperature difference ΔTs calculated in step S34 to the ambient temperature Ta indicated by the ambient temperature information acquired in step S33 (step S36). The controller 66 also functions as the temperature calculation unit.

After executing step S36, the controller 66 updates the switch temperature stored in the storage unit 65 to the switch temperature calculated in step S36 (step S37), and ends the temperature update processing.

FIG. 7 is a flowchart showing a procedure of the change processing. Similarly to Embodiment 1, the controller 66 cyclically executes the change processing. Cycles related to the temperature update processing and the change processing are approximately the same. The temperature update processing is preferably executed immediately before the change processing.

Steps S41, and S43 to S51 of the change processing in Embodiment 2 are respectively similar to steps S11, and S13 to S21 of the change processing in Embodiment 1. Thus, detailed description of steps S41, and S43 to S51 will be omitted.

If the controller 66 has determined that the state flag value is not zero (step S41: NO), then the controller 66 reads out the switch temperature stored in the storage unit 65 (step S42). Thereafter, the controller 66 executes step S43.

In step S44, the controller 66 determines whether or not the switch temperature that was read out in step S42 is at least the relay ON-threshold. In step S48, the controller 66 determines whether or not the switch temperature that was read out in step S42 is lower than the relay OFF-threshold.

In the temperature update processing performed by the power supply control device 10 in Embodiment 2, a temperature difference between the switch temperature and the ambient temperature of the switch circuit 2 is accurately calculated based on the previously calculated preceding temperature difference, the electric current flowing through the switch circuit 2, and the ambient temperature of the switch circuit 2. Also, an accurate switch temperature is calculated by adding this temperature difference to the ambient temperature of the switch circuit 2.

The power supply control device 10 in Embodiment 2 similarly achieves, out of the effects achieved by the power supply control device 10 in Embodiment 1, all effect other than the effect attained by the switch temperature being the higher one of the temperatures at the drains of the semiconductor switches 20a and 20b.

Note that the controller 66 may not cyclically execute the temperature update processing, that is, computing the switch temperature in Embodiment 2. The controller 66 should execute the temperature update processing chronologically. In this case, the microcontroller 6 has a timer configured to measure a time interval at which the temperature update processing is executed. In step S34 of the temperature update processing, the controller 66 substitutes, as a time interval τ, the time interval measured by the timer into Computation Equations (1) and (2).

Also, the temperature that is used as the preceding temperature difference is not limited to the temperature difference calculated in the previous temperature update processing, and may also be the temperature difference calculated in the temperature update processing before the last one.

Furthermore, a configuration for detecting an electric current flowing through the switch circuit 2 is not limited to the configuration in which the electric current sensor 71 is used. The power supply control device 10 in Embodiment 2 may also include a resistor connected in series to the switch circuit 2 and a differential amplifier configured to output, to the input unit 83, the product of a voltage across both ends of this resistor and a predetermined number, as electric current information, instead of the electric current sensor 71. In this case, the resistor and the differential amplifier function as electric current detection units. Furthermore, both or one of the ON-resistances of the semiconductor switches 20a and 20b may also be used, instead of the above-described resistor.

Note that in Embodiments 1 and 2, the relay OFF-threshold is not limited to being lower than the relay ON-threshold, but should be not more than the relay ON-threshold. Also, at the relay contact 30, objects to be connected to the NO-terminal 30a and the COM-terminal 30b may also be exchanged.

Furthermore, the switch circuit 2 is not limited to a circuit in which the source of the semiconductor switch 20a is connected to the source of the semiconductor switch 20b. The switch circuit 2 may also be a circuit in which the drain of the semiconductor switch 20a is connected to the drain of the semiconductor switch 20b, for example. In this case, with the semiconductor switches 20a and 20b, objects to be connected to their drains and sources are exchanged. If the drain of the semiconductor switch 20a is connected to the drain of the semiconductor switch 20b, the number of switch temperature sensors of the power supply control device 10 in Embodiment 1 may also be one. In this case, the power supply control device 10 in Embodiment 1 should include one of the switch temperature sensors 5a and 5b.

Also, in Embodiments 1 and 2, the semiconductor switches 20a and 20b are not limited to N-channel FETs, and may also be P-channel FETs, as long as the semiconductor switches 20a and 20b are of the same type.

Furthermore, the number of semiconductor switches of the switch circuit 2 may also be one. In this case, the semiconductor switch is disposed such that the forward direction of a parasitic diode connected between the drain and the source of this semiconductor switch coincides with a direction from the load 12 to the battery 11.

Also, the semiconductor switch of the switch circuit 2 is not limited to an FET, and may also be a bipolar transistor, for example.

With the power supply control devices 10 in Embodiments 1 and 2 having the above-described configurations, the semiconductor switch is prevented from having a high temperature, and the frequency of switching on and off the relay contact 30 is low.

Embodiments 1 and 2 that were disclosed are to be considered exemplary in all respects and in no way limiting. The scope of the present disclosure is defined by the scope of the appended claims and not by the above description, and all changes that fall within the same essential spirit as the scope of the claims are included therein.

The invention claimed is:

1. A power supply control device configured to control supply of power via a switch circuit including a semiconductor switch and a relay contact connected in parallel to the switch circuit, the power supply control device comprising:
   a first determination unit configured to determine whether or not a switch temperature of the switch circuit is at least a first threshold when the semiconductor switch is on and the relay contact is off;
   a first switching unit configured to, if the first determination unit has determined that the switch temperature is at least the first threshold, switch on the relay contact and switch off the semiconductor switch;
   a second determination unit configured to determine whether or not the switch temperature is lower than a second threshold that is not more than the first threshold when the semiconductor switch is off and the relay contact is on; and
   a second switching unit configured to, if the second determination unit has determined that the switch temperature is lower than the second threshold, switch on the semiconductor switch and switch off the relay contact.

2. The power supply control device according to claim 1, wherein the semiconductor switch is an FET, and
   the switch temperature is a temperature at a drain of the semiconductor switch.

3. The power supply control device according to claim 2, further comprising:
   an electric current detection unit configured to detect an electric current flowing through the switch circuit; and
   a temperature calculation unit configured to calculate the switch temperature based on the electric current detected by the electric current detection unit.

4. The power supply control device according to claim 2, wherein a number of semiconductor switches of the switch circuit is two,
a source of one of the semiconductor switches is connected to a source of the other of the semiconductor switches,
the relay contact is connected between drains of the two semiconductor switches, and
the switch temperature is the higher one of the temperatures at the drains of the two semiconductor switches.

5. The power supply control device according to claim 4, further comprising:
an electric current detection unit configured to detect an electric current flowing through the switch circuit; and
a temperature calculation unit configured to calculate the switch temperature based on the electric current detected by the electric current detection unit.

6. The power supply control device according to claim 1, further comprising:
an electric current detection unit configured to detect an electric current flowing through the switch circuit; and
a temperature calculation unit configured to calculate the switch temperature based on the electric current detected by the electric current detection unit.

7. The power supply control device according to claim 6, comprising:
a temperature detection unit configured to detect an ambient temperature of the switch circuit,
wherein the temperature calculation unit includes a temperature difference calculation unit configured to chronologically calculate a temperature difference between the ambient temperature and the switch temperature of the switch circuit,
the temperature difference calculation unit calculates the temperature difference based on the electric current detected by the electric current detection unit and a preceding temperature difference that was calculated in advance, and
the switch temperature is calculated by adding the temperature difference calculated by the temperature difference calculation unit to the ambient temperature detected by the temperature detection unit.

8. A power supply control method for controlling supply of power via a switch circuit including a semiconductor switch and a relay contact connected in parallel to the switch circuit, the method comprising:
a step of determining whether or not a switch temperature of the switch circuit is at least a first threshold when the semiconductor switch is on and the relay contact is off;
a step of, if it is determined that the switch temperature is at least the first threshold, switching on the relay contact and switching off the semiconductor switch;
a step of determining whether or not the switch temperature is lower than a second threshold that is not more than the first threshold when the semiconductor switch is off and the relay contact is on; and
a step of, if it is determined that the switch temperature is lower than the second threshold, switching on the semiconductor switch and switching off the relay contact.

9. A computer program product for causing a computer to control supply of power via a switch circuit including a semiconductor switch and a relay contact connected in parallel to the switch circuit, the computer program product including a non-transitory, machine-readable medium storing instructions which, when executed by at least one programmable processor, caused at least one programmable processor to execute:
a step of determining whether or not a switch temperature of the switch circuit is at least a first threshold when the semiconductor switch is on and the relay contact is off;
a step of, if it is determined that the switch temperature is at least the first threshold, switching on the relay contact and switching off the semiconductor switch;
a step of determining whether or not the switch temperature is lower than a second threshold that is not more than the first threshold when the semiconductor switch is off and the relay contact is on; and
a step of, if it is determined that the switch temperature is lower than the second threshold, switching on the semiconductor switch and switching off the relay contact.

* * * * *